(12) United States Patent
Van Haren et al.

(10) Patent No.: US 7,271,073 B2
(45) Date of Patent: Sep. 18, 2007

(54) MARKER FOR ALIGNMENT OF NON-TRANSPARENT GATE LAYER, METHOD FOR MANUFACTURING SUCH A MARKER, AND USE OF SUCH A MARKER IN A LITHOGRAPHIC APPARATUS

(75) Inventors: Richard Johannes Franciscus Van Haren, Waalre (NL); Sanjaysingh Lalbahadoersing, Helmond (NL); Henry Megens, Eindhoven (NL)

(73) Assignee: ASML Nertherlands B.V., Veldhoven (NL)

(*) Notice: Subject to any disclaimer, the term of this patent is extended or adjusted under 35 U.S.C. 154(b) by 121 days.

(21) Appl. No.: 10/879,707

(22) Filed: Jun. 30, 2004

(65) Prior Publication Data

US 2006/0003540 A1 Jan. 5, 2006

(51) Int. Cl.
*H01L 21/66* (2006.01)
*H01L 21/67* (2006.01)
(52) U.S. Cl. .................... 438/401; 438/975; 250/559.3
(58) Field of Classification Search ................ 438/401, 438/975, 424, 427, 433; 250/559.3
See application file for complete search history.

(56) References Cited

U.S. PATENT DOCUMENTS

| | | | |
|---|---|---|---|
| 6,368,937 B1 * | 4/2002 | Nakamura ................. 438/401 |
| 6,440,816 B1 * | 8/2002 | Farrow et al. .............. 438/401 |
| 6,656,815 B2 * | 12/2003 | Coolbaugh et al. ......... 438/401 |
| 6,753,236 B2 * | 6/2004 | Feldner et al. ............. 438/401 |
| 6,825,096 B2 * | 11/2004 | Weis .......................... 438/401 |
| 6,958,281 B2 * | 10/2005 | Kwon ........................ 438/401 |
| 6,995,060 B2 * | 2/2006 | Ding .......................... 438/257 |
| 2002/0102811 A1 * | 8/2002 | Farrow et al. .............. 438/401 |
| 2003/0119274 A1 * | 6/2003 | Weis .......................... 438/401 |
| 2004/0114143 A1 * | 6/2004 | Van Haren et al. ......... 356/401 |
| 2004/0198018 A1 * | 10/2004 | Fukuda ....................... 438/401 |
| 2005/0009287 A1 * | 1/2005 | Oh et al. .................... 438/401 |
| 2005/0189502 A1 * | 9/2005 | Van Bilsen et al. ...... 250/559.3 |
| 2006/0057815 A1 * | 3/2006 | Kim ........................... 438/401 |

* cited by examiner

*Primary Examiner*—M. Wilczewski
(74) *Attorney, Agent, or Firm*—Pillsbury Winthrop Shaw Pittman, LLP

(57) ABSTRACT

A method for manufacturing a marker structure including line elements and trench elements arranged in a repetitive order includes filling the trench elements with silicon dioxide and leveling the marker structure. A sacrificial oxide layer is grown on the semiconductor surface, and a first subset of the line elements is exposed to an ion implantation beam including a dopant species to dope and change an etching rate of the first subset. The substrate is annealed to activate the dopant species, and the semiconductor surface is etched to remove the sacrificial oxide layer and to level the first subset to a first level and to create a topology such that the first subset has a first level differing from a second level of a surface portion of the marker structure different from the first subset.

13 Claims, 4 Drawing Sheets

MARKER FOR ALIGNMENT OF NON-TRANSPARENT GATE LAYER, METHOD FOR MANUFACTURING SUCH A MARKER, AND USE OF SUCH A MARKER IN A LITHOGRAPHIC APPARATUS

FIELD OF THE INVENTION

The present invention relates to lithographic apparatus and methods.

BACKGROUND

A lithographic apparatus is a machine that applies a desired pattern onto a target portion of a substrate. Lithographic apparatus can be used, for example, in the manufacture of integrated circuits (ICs). In that circumstance, a patterning structure, such as a mask, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at once, and so-called scanners, in which each target portion is irradiated by scanning the pattern through the projection beam in a given direction (the "scanning"-direction) while synchronously scanning the substrate parallel or anti-parallel to this direction.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning structure" used herein should be broadly interpreted as referring to a structure that can be used to impart a projection beam with a pattern in its cross-section such as to create a pattern in a target portion of the substrate. It should be noted that the pattern imparted to the beam of radiation may not exactly correspond to the desired pattern in the target portion of the substrate. Generally, the pattern imparted to the beam of radiation will correspond to a particular functional layer in a device being created in the target portion, such as an integrated circuit.

A patterning structure may be transmissive or reflective. Examples of patterning structures include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e. bares the weight of, the patterning structure. It holds the patterning structure in a way depending on the orientation of the patterning structure, the design of the lithographic apparatus, and other conditions, such as for example whether or not the patterning structure is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning structure is at a desired position, for example with respect to the projection system. Any use of the terms "reticle" or "mask" herein may be considered synonymous with the more general term "patterning structure".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

For the purpose of alignment, marker structures may be used which by their interaction with an impinging light beam (or alignment beam) generate one or more diffracted beams. From information collected from the one or more diffracted beams, the position of the marker relative to a position of the pattern on the mask can be determined. Typically, a marker consists of some periodic structure such as a grating, which includes a sequence of lines and trenches.

During the manufacturing process two scenarios may be used for the alignment of patterns at the gate level of a transistor.

Firstly, stand-alone alignment markers are exposed and subsequently etched in a zero layer (i.e., the base plane of a substrate) during a lithographic process. Alternatively, scribelane alignment markers are exposed and etched together with the first product layer, e.g. shallow trench isolation (STI). In the latter case, the processing of the zero layer is combined with a processing of a first layer.

The alignment marks basically follow the process flow of the product. After the etching, the trenches are filled with silicon dioxide (followed by a planarisation step). For a subsequent formation of, for example, a (MOSFET) transistor, a gate layer stack (for forming a gate) is deposited in blanket mode, also covering the marker structure of silicon dioxide filled trenches. The gate layer stack is either optically transparent or opaque to the radiation from the alignment beam. If the stack is transparent, then, the alignment beam can still reach the grating below the gate layer stack. In case the gate layer stack is opaque, no information can be obtained from the grating anymore.

Stand-alone zero layer markers are formed by an exposure step and a subsequent etching of the substrate top layer (i.e., silicon), before the actual process flow for creating a device structure such as an integrated circuit can be started. This pre-processing step of exposure and etching not only adds to the costs of manufacturing but it may lead to additional die losses and may adversely affect the yield on neighboring dies.

The use of scribelane markers may help in addressing issues associated with stand-alone markers in circumstances where the gate layer stack is transparent for the radiation of the alignment beam. In case the gate layer stack is opaque and the topology (i.e., the footprint of the grating structure on the surface of the gate layer stack) is negligible, a repair step becomes desirable to maintain alignment. Such a repair step may involve opening the gate layer stack to reach the original marker again. Moreover, a repair step adds further costs.

Also, the opacity of the gate layer stack may pose a problem for metrology tools in general.

SUMMARY

Embodiments of the invention include a method for manufacturing a marker structure on a semiconductor substrate with a semiconductor surface, the marker structure including line elements and trench elements, the line elements and trench elements being arranged in a repetitive order in the marker structure. According to an embodiment of the invention, the method includes filling the trench elements with silicon dioxide and leveling the marker structure; growing a sacrificial oxide layer on the semiconductor surface; exposing at least a first subset of the line elements to at least a first ion implantation beam, for collecting at least a first dopant species from the ion implantation beam, to dope a first exposed subset of line elements, and to change an etching rate of the first exposed subset of line elements, the first ion implantation beam including a first dopant species and having first ion implementation beam characteristics; annealing the substrate to activate the at least first dopant species in the first exposed subset of line elements; and etching the semiconductor surface to remove the sacrificial oxide layer, and at the same time to create a topology of the first exposed subset of line elements, such that the first exposed subset of line elements has a first level differing from a second level of a marker structure surface portion differing from said first exposed subset of line elements.

In another embodiment of the invention, a method includes filling the trench elements with silicon dioxide and leveling the marker structure; growing a sacrificial oxide layer on the semiconductor surface; exposing at least a first subset of the line elements to at least a first ion implantation beam to dope at least the first subset of line elements and to change an etching rate of at least the first subset of line elements, the first ion implantation beam including a first dopant species and having first ion implementation beam characteristics; annealing the substrate to activate the first dopant species in at least the first subset of line elements; and etching the semiconductor surface to remove the sacrificial oxide layer and to create a topology such that the first subset of line elements has a first level differing from a second level of a surface portion of the marker structure different from the first subset of line elements.

According to another embodiment of the present invention, there is provided a marker structure on a semiconductor substrate, the marker structure comprising line elements and trench elements, the line elements and trench elements being arranged in a repetitive order in the marker structure, wherein the marker structure includes at least a first subset of line elements which have a first level differing from a second level of a marker structure surface portion differing from said first subset of line elements.

According to an embodiment of the invention, a marker structure disposed on a semiconductor substrate includes a plurality of line elements; and a plurality of trench elements, wherein the plurality of line elements and trench elements are arranged in a repetitive order in the marker structure, and wherein at least a first subset of the plurality of line elements has a first level and at least a remaining surface portion of the marker structure has a second level, the first level differing from the second level.

According to a further embodiment of the invention, there is provided a device manufacturing method including manufacturing a marker structure on a substrate (e.g. according to an embodiment of the invention as described above), determining a position of the marker structure, and based on the determining, projecting a patterned beam of radiation onto a radiation-sensitive layer of the substrate.

According to another embodiment of the present invention, there is provided a substrate including at least one marker structure, the at least one marker structure including line elements and trench elements, the line elements and trench elements being arranged in a repetitive order in the marker structure wherein the marker structure includes at least a first subset of line elements which have a first level differing from a second level of a marker structure surface portion differing from the first subset of line elements.

In yet another embodiment of the invention, a substrate includes at least one marker structure, the at least one marker structure including a plurality of line elements and trench elements, the plurality of line elements and trench elements being arranged in a repetitive order in the marker structure, wherein at least a first subset of the plurality of line elements has a first level and a remaining surface portion of the marker structure has a second level, the first level differing from the second level.

According to an embodiment of the invention, a marker structure includes a plurality of lines of a first material and a plurality of trenches of a second material, the plurality of lines and trenches being alternately and contiguously disposed in a substrate, wherein a first subset of the plurality of lines has a different elevation than the plurality of trenches.

In another embodiment of the invention, a method for aligning a substrate relative to a mask in a lithographic apparatus includes projecting a beam of light onto a marker structure disposed on the substrate; detecting light diffracted by the marker structure; and adjusting a position of the substrate on the basis of the diffracted light, wherein the marker structure includes a plurality of lines of a first material and a plurality of trenches of a second material, the plurality of lines and trenches being alternately and contiguously disposed in a substrate, and wherein a first subset of the plurality of lines has a different elevation than the plurality of trenches.

In another embodiment of the invention, a method for manufacturing a marker structure at a surface of a substrate, the marker structure comprising line elements and trench elements arranged in a repetitive order, includes filling the trench elements with silicon dioxide; growing a sacrificial oxide layer on the surface; exposing at least a first subset of the line elements to an ion implantation beam to change an etching rate of the first subset, said ion implantation beam comprising a dopant species; annealing the substrate to activate the dopant species in the first subset; and etching the semiconductor surface to remove the sacrificial oxide layer and to create a plurality of levels on the surface such that the first subset of line elements has a first level differing from a second level of a surface portion of the marker structure different from the first subset of line elements.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Embodiments of the present invention include a method for alignment on opaque gate stacks without the need to perform any repair step.

Figure 1:
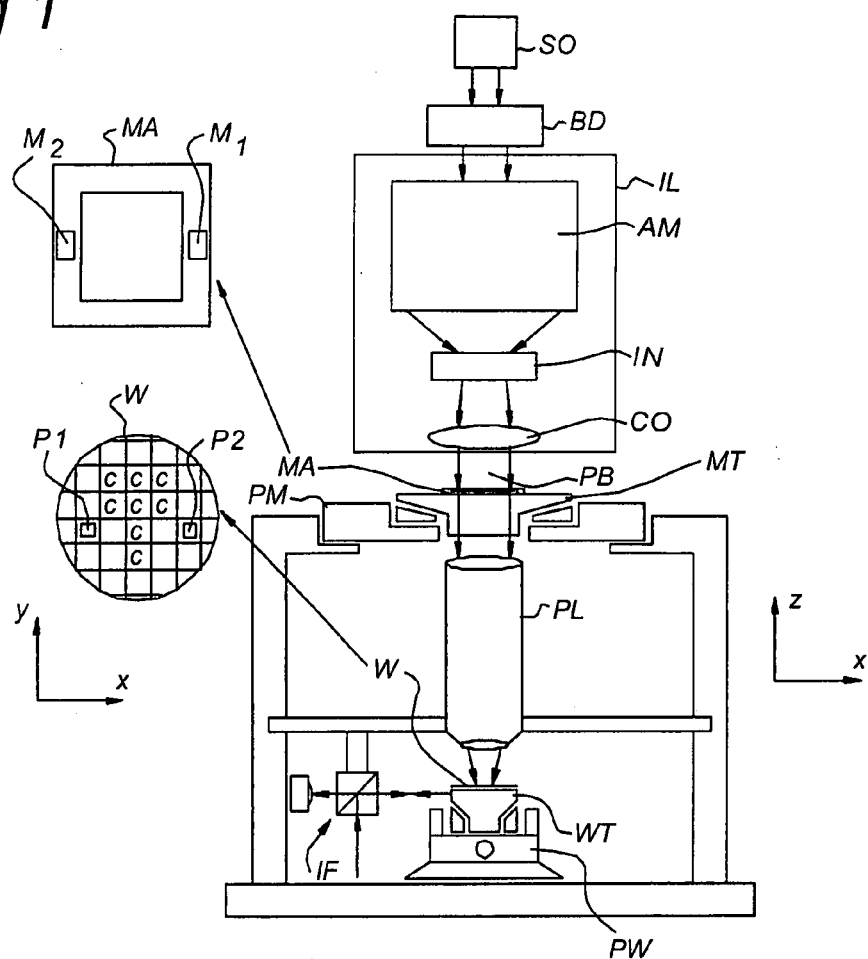
FIG. 1 depicts a lithographic apparatus according to an embodiment of the invention.

FIG. 1 schematically depicts a lithographic apparatus according to an embodiment of the invention. The apparatus includes an illumination system (illuminator) IL configured to provide a beam PB of radiation (e.g. UV or EUV radiation) and a first support structure (e.g. a mask table) MT configured to support a patterning structure (e.g. a mask) MA and connected to a first positioning device PM configured to accurately position the patterning structure with respect to the projection system ("lens") item PL. The apparatus also includes a substrate table (e.g. a wafer table) WT configured to hold a substrate (e.g. a resist-coated wafer) W and connected to a second positioning device PW configured to accurately position the substrate with respect to the projection system ("lens"), item PL, and a projection system (e.g. a reflective projection lens) PL configured to image a pattern imparted to the beam of radiation PB by a patterning structure MA onto a target portion C (e.g. including one or more dies) of the substrate W.

As here depicted, the apparatus is of a reflective type (e.g. employing a reflective mask or a programmable mirror array of a type as referred to above). Alternatively, the apparatus may be of a transmissive type (e.g., employing a transmissive mask).

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector including, for example, suitable collecting mirrors and/or a spectral purity filter. In other cases the source may be an integral part of the apparatus, for example when the source is a mercury lamp. The source SO and the illuminator IL may be referred to as a radiation system.

The illuminator IL may include an adjusting structure configured to adjust the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the beam of radiation PB, having a desired uniformity and intensity distribution in its cross-section.

The beam of radiation PB is incident on the mask MA, which is held on the mask table MT. Being reflected by the mask MA, the beam of radiation PB passes through the lens PL, which focuses the beam onto a target portion C of the substrate W. With the aid of the second positioning device PW and position sensor IF2 (e.g. an interferometric device), the substrate table WT can be moved accurately, e.g. so as to position different target portions C in the path of the beam PB. Similarly, the first positioning device PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning means PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the beam of radiation is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the beam of radiation is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning structure, and the substrate table WT is moved or scanned while a pattern imparted to the beam of radiation is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structures, such as a programmable mirror array of a type as referred to above.

Combinations and/or variations on the above described modes of use or entirely different modes of use may also be employed.

Figure 2:
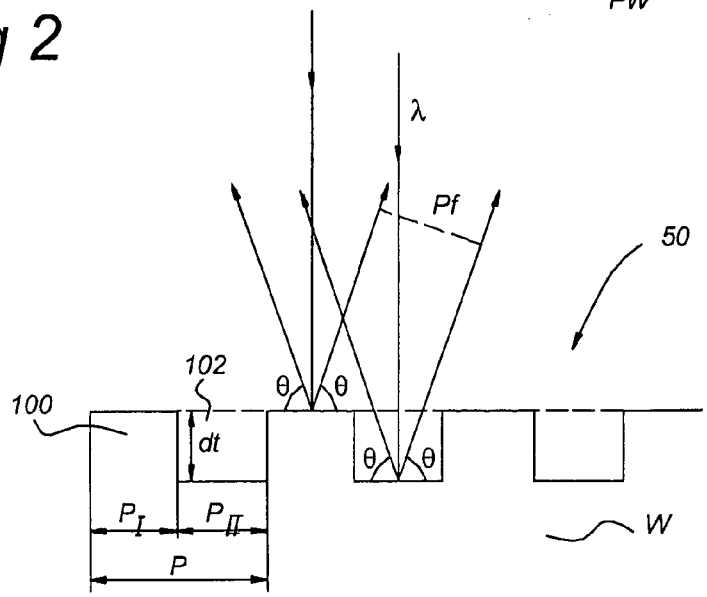
FIG. 2 depicts an exemplary marker structure on a substrate.

FIG. 2 depicts an exemplary marker structure on a substrate. The substrate W may be a semiconductor wafer which is being used in the manufacturing of semiconductor devices.

As can be seen in FIG. 2, the optical marker structure includes a grating with a periodicity P suitable for diffraction of impinging light with a wavelength λ well within the visible range of the spectrum. It will be appreciated that it is not essential that the periodicity P be suitable for diffraction of light within the visible spectrum, and that embodiments of the invention can be implemented with a periodicity P suitable for shorter wavelengths or suitable for longer wavelengths. The term "light" as used herein is not limited to wavelengths within the visible spectrum but may encompass light of longer wavelength or shorter wavelength than visible wavelengths.

The grating consists of a series of lines 100, with interposed trenches 102 in the surface of substrate W. The trenches 102 have a depth $d_t$, with respect to the top surface of the lines 100. The periodicity P of the grating is composed of a line width $P_I$ and a trench width $P_{II}$.

In FIG. 2, an impinging light beam with wavelength λ is directed in a direction substantially perpendicular to the surface of the substrate. Alternatively, a non-perpendicular inclination of the impinging beam may be used as well.

The marker grating of FIG. 2 is a so-called phase grating. A diffraction pattern is schematically shown by two diffracted beams, each having a diffraction angle θ relative to the surface.

In the diffraction pattern, the position of intensity maxima and minima is governed by the periodicity of the grating. When the wavelength λ of the impinging light is within the range of visible light, periodicity P may typically be 16/n microns (where n is 1,2, . . . 7) to obtain a diffraction pattern suitable for purpose of alignment. Typically, the line width $P_I$ and trench width $P_{II}$, are each 8/n microns (n ∈ {1, 2, . . . , 7}).

In order to obtain sufficient diffracted light from the grating and to obtain an angular distribution (a diffraction pattern) of well-defined diffraction maxima and minima, it may be desirable that the grating encompass a minimal number of lines and intermediate trenches which are illuminated by the impinging light beam. Generally, a marker includes at least 10 trenches within the illuminated area.

The intensity of the diffracted beams is further determined by the depth of the trenches relative to the top surface of the lines. In a certain direction of diffracted light, the light rays scattered at the top surface of the lines and the light rays scattered at the bottom of the trenches should have a certain phase relation to obtain a positive interference between these light rays in that direction, independent from the periodicity P. The depth of the trenches relative to the surface of the lines should be such that positive interference will occur, else if the interference is negative, an extinction of the signal will occur. This is known as the phase depth condition.

In the phase grating, the interference in the diffraction pattern can be schematically deduced as follows: under angle θ a first set of photons reflect on the top surfaces of the lines 100, while a second set of photons reflect at the floor of the trenches 102. In a given direction θ, an intensity maximum will occur, when the phase difference of light beams scattering from the line top surfaces and from the trench floors is substantially zero at the propagation front PF of the diffracted beam.

For an optical marker structure on a semiconductor wafer, the structure may be exposed to various deformations during the processing steps of the semiconductor wafer to form integrated circuits. Due to these deformations the phase depth $d_t$ may change during manufacturing.

It is noted that the grating structure of FIG. 2 may still be usable (i.e., controlled by the phase depth condition) when the grating is covered with a material which is transparent for the radiation of the impinging light (with the index of refraction taken into account). However, the grating and its marker function are lost when the structure is covered by an opaque layer which prevents the impinging radiation from interacting with the marker structure. After deposition of an opaque layer over the marker structure, a repair step to uncover the marker structure may be required to make the marker usable for an alignment step at the gate level.

Figure 3:
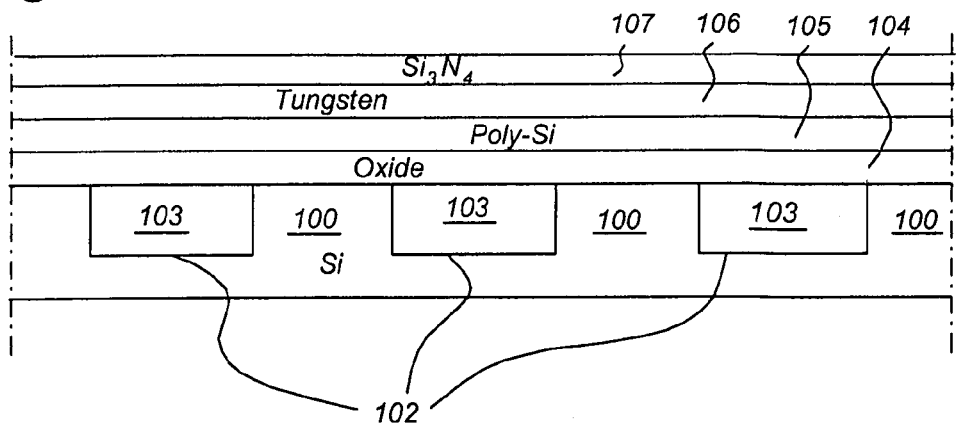
FIG. 3 depicts a marker structure covered by a first exemplary gate layer stack.

FIG. 3 depicts a marker structure covered by a first exemplary gate layer stack.

A first type of gate layer stack that destroys the marker capabilities of a grating is a gate layer stack which includes a tungsten layer 106.

Due to the manufacturing of a semiconductor device on the substrate, as an example, a gate layer stack is deposited in a sequence of operations involving deposition and etching of layers. One example of such a sequence follows:

The lines 100 of the marker typically consist of the substrate material, e.g., Si. The trenches 102 are now filled with silicon dioxide 103 which has been leveled with the top of the lines 100, for example by a subsequent chemical-mechanical polishing step (CMP). It is noted that after CMP, an etching step for removal of a sacrificial silicon nitride which was used as a mask (not shown) may be carried out. After that, an oxide strip is typically carried out for obtaining oxide-free Si surfaces.

Then, a growth of an silicon dioxide layer 104 is carried out. This silicon dioxide layer 104 will form a gate oxide layer of a semiconductor device, at this point still in an embryonic state. Next, a poly-Si layer (second layer) 105 is deposited typically in a blanket mode, fully covering the substrate. The poly-Si layer 105 covers the marker structure fully. On top of the poly-Si layer 105, a tungsten layer 106 may be deposited, typically by a tungsten chemical vapor deposition process (W-CVD) but a W sputtering process is possible as well. Also, the tungsten layer 106 fully covers the marker structure. Finally, a silicon nitride layer 107 is deposited as insulation/passivation layer.

It is noted that embodiments of the present invention may include applying the ion-implantation step prior to the growth/deposition of the poly-Si layer 105 to obtain self-alignment with the marker structure 100, 102.

Note that depending on their respective thickness and the used radiation wavelength, the poly-Si layer 105 and the silicon nitride layer 107 may individually be still transparent to an impinging light beam LB. Due to its electronic properties, the tungsten layer 106 is however opaque and blocks the interaction between light beam LB and the marker.

Figure 4:
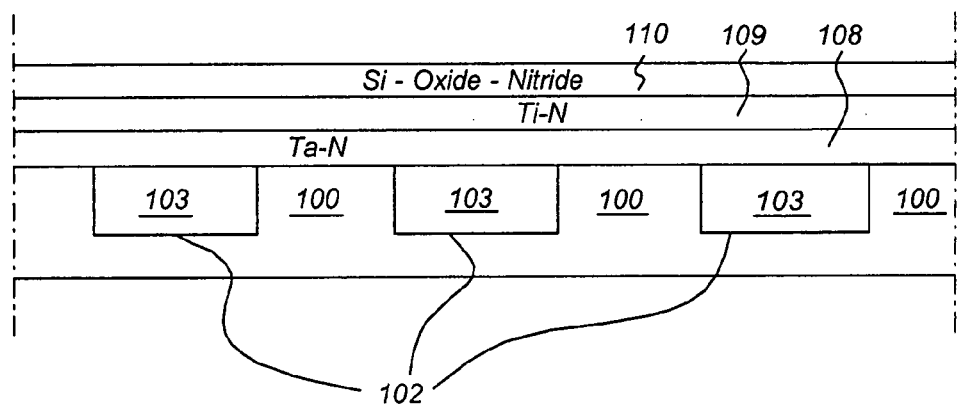
FIG. 4 depicts a marker structure covered by a second exemplary gate layer stack.

FIG. 4 depicts a marker structure covered by a second exemplary gate layer stack.

A second type of gate layer stack that may destroy the marker capabilities of a grating is a gate layer stack (metal gate stack) which includes typically (from bottom to top), a gate oxide ($SiO_2$), a titanium nitride (TiN) or tantalum nitride (TaN) and a silicon-oxy-nitride layer ($SiO_xN_y$) as capping layer.

Due to the manufacturing of a semiconductor device on the substrate, a metal gate layer stack may be deposited, for example, to form a semiconductor device.

In this case, the lines 100 of the marker typically consists of the substrate material, e.g., Si. The trenches 102 are filled with silicon dioxide 103 which has been leveled with the top of the lines 100, for example, by a chemical-mechanical polishing step.

As before, an etching step for removal of a sacrificial silicon nitride (not shown) and an oxide strip for obtaining oxide-free Si surfaces may also be carried out.

A tantalum nitride layer (second layer) 108 is deposited and covers the marker structure fully.

On top of the tantalum nitride layer 108, a titanium nitride layer 109 may optionally be deposited. The tantalum nitride layer also fully covers the marker structure. Finally, a silicon-oxy-nitride layer 110 may be deposited on top of the titanium nitride layer 109 (or tantalum nitride layer 108).

The optical properties of the titanium nitride and/or tantalum nitride layer and the silicon-oxy-nitride layer are such that, effectively, these layers are opaque and block the interaction between the light beam LB and the marker below the gate layer stack.

Note that similar problems may occur in other gate layer stacks that may consist of other constituent materials and/or relate to other types or designs of semiconductor devices.

In an embodiment of the present invention, there is provided a method for detecting a marker structure covered by an opaque layer without the need of costly repair steps. In an embodiment of the invention, a surface modification of the opaque layer including first elevated surface regions and second relatively lower surface regions is carried out. The sequence of the first and second surface regions corresponds to the periodic structure of the marker and provides a surface marker which may be detectable in the same manner as the marker structure below the surface structure.

Since the surface structure is aligned with the original marker structure below the opaque layer, the surface structure can be used for alignment purposes in the same way as the original marker. This will be explained with reference to FIGS. 5-11.

Figure 5:
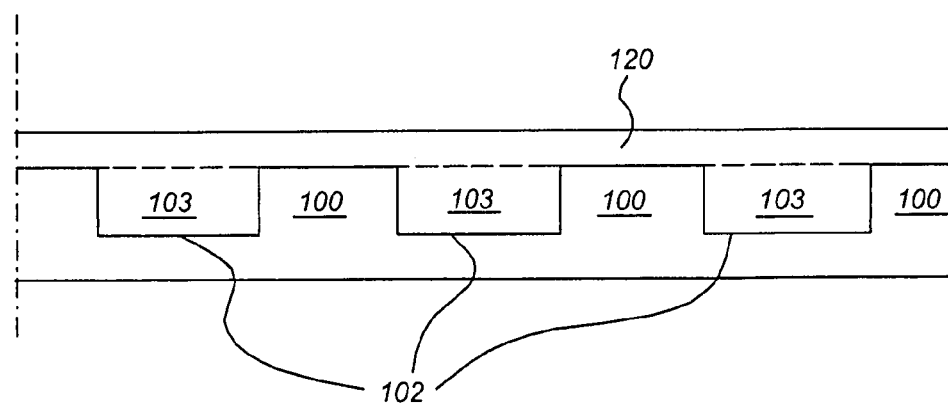
FIG. 5 shows a cross-sectional view of a portion of a marker structure after a first processing sequence according to an embodiment of the invention.

FIG. 5 shows a cross-sectional view of a portion of a marker structure after a first processing sequence.

During front-end processing of a semiconductor device, as a first step, the marker structure is formed in the substrate by creating a marker pattern into which trenches are etched. Next, silicon dioxide 103 is deposited for filling the trenches. Subsequently, a silicon nitride layer (not shown) may be deposited or may be already present on some areas of the substrate. Then, a CMP step is carried out to level the surface of the substrate. After completing that step, the silicon nitride layer, which is present on the surface of the substrate, is removed in a stripping process. This operation can be done by wet etching. Further, an oxide strip (etch) is done to remove oxide from the Si surface. Next, a thin sacrificial oxide layer 120 may be grown on the Si surface. The interface between trench oxide 103 and sacrificial oxide 120 is indicated by a dashed line, the interface between sacrificial oxide 120 and silicon is shown as a solid line. The thin sacrificial oxide layer 120 is used for creating gate oxide on the substrate regions where field effect transistors are being formed.

In an embodiment of the present invention, this sacrificial oxide layer 120 is also used as a scattering medium for an incoming ion beam in subsequent ion implantation steps. Channeling of ions from the ion beam in the Si crystal structure may be prevented and a diffusion profile can be accurately controlled. The sacrificial oxide layer 120 above the marker structure may later be removed during a subsequent etching process e.g. after completion of the implanted layers. This part of the process flow (i.e., dopant profile control by the sacrificial oxide 120 and the removal of the oxide 120 by etching, as discussed with reference to FIG. 7) may support advantages as described herein.

At this stage of processing, the marker structure includes a plurality of lines 100 and trenches 102. The trenches are filled with silicon dioxide 103. The lines 100 are covered by the thin oxide layer 120.

Figure 6:
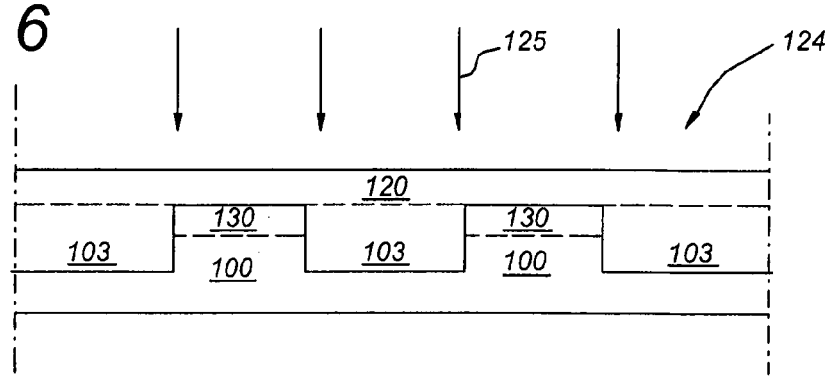
FIG. 6 shows a cross-sectional view of a portion of a marker structure after a first subsequent processing step according to an embodiment of the invention.

FIG. 6 shows a cross-sectional view of a portion of a marker structure after a first subsequent processing step, according to an embodiment of the invention. In FIG. 6, an entity with a same reference number refers to the same entity with that number as shown in the preceding figures.

In the first subsequent step, an ion implantation process is carried out for creating doped silicon regions in the field effect transistors. The doped regions are created to define source and drain regions for a field effect transistor. Typically, the implantation process uses a mask defined by a patterned resist masking layer with openings above the doped regions to allow the ion beam to enter the relevant substrate regions.

In existing methods, the marker structure region is typically not exposed to the ion beam, i.e., the resist masking layer covers the marker structure completely, and the marker structure is left unexposed during the ion implantation process step.

In an embodiment of the present invention, the resist masking layer includes a mask pattern portion 124 above the marker structure in which at least a first subset of silicon lines 100 of the marker structure are left open for exposure to the ion beam 125 during the implantation step. The ion beam 125 includes ions of a dopant species suitable for changing the electronic properties of the Si matrix, such as As, Sb, B, and P.

Note that the first subset may be a full set of all lines 100 within the marker structure, but, as will be explained with reference to FIG. 11, may also include only a portion of them, i.e., a selection of a first subset of lines is made from all lines. It may be desirable to make this selection in such a way that the lines within the first subset also are arranged periodically.

As a result of exposure to the ion beam 125, the exposed areas 130 of the marker structure (i.e., at least the first subset of silicon lines 100 of the marker structure) are irradiated with a dose of a dopant type that is present in the ion beam 125. Thus the exposed areas 130 are relatively enriched by the dopant type. Note that the pattern portion 124 may mask (i.e., cover) the surface location of the trenches 102, but this is not necessary. Implantation of dopant species in the oxide regions 120, 103 is allowed, since the etching rate of the silicon dioxide regions is substantially not affected by the implantation.

After exposure, the resist masking layer is stripped. Further, an activation step (a heat treatment step) may be carried out to activate the dopants in the Si areas for creating field effect transistor(s). Also, the Si portions 130 of the marker structure which were exposed, become activated during this activation step.

It should be noted that the ion beam 125 has certain characteristics such as ion beam energy, and flux, which for a given dopant species will result in a certain specific dopant distribution in the exposed surface regions.

Figure 7:
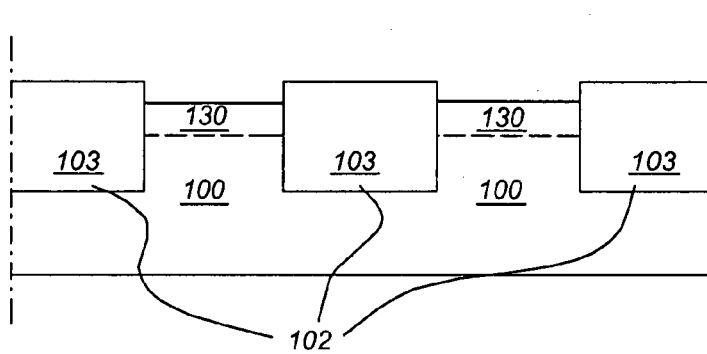
FIG. 7 shows a cross-sectional view of a portion of a marker structure after a second subsequent processing step according to an embodiment of the invention.

FIG. 7 shows a cross-sectional view of a portion of a marker structure after a second subsequent processing step, according to an embodiment of the invention.

In the second subsequent processing step, the sacrificial oxide surface layer 120 in the area of the field effect transistors under construction may be removed by a wet etching process which also etches the silicon below the sacrificial oxide surface layer 120 as soon as sacrificial oxide surface layer 120 is removed by the etching. Thus, the removal of the sacrificial oxide layer may introduce elevation differences between silicon dioxide and the doped Si line elements of the first subset. Also, elevation differences may be introduced between intrinsic (undoped), n-doped, and p-doped silicon areas due to differences in etching rate between implanted and non-implanted surface regions, which regions can be defined by the actual layout of the mask pattern 124 over the marker structure. In an embodiment of the present invention, the etching step in the marker structure area creates a distribution of elevated and lower regions, since the etching properties of Si may depend on the impurity elements (dopant species) contained therein and also, on the relative concentration. The doped silicon regions exhibit different etching rates than the unexposed Si regions and/or the silicon dioxide regions of the marker, due to the presence of a dopant species and its relative concentration.

An intrinsic Si portion may have, for example, a lower etching rate than a doped Si region 130, for a given etch recipe and a given etchant (concentration). Since both the intrinsic and doped regions are etched simultaneously, the amount of removal of silicon from each of the regions may thus be different.

It is noted that a similar effect for creating a topology may be achieved by a suitable dry etching process, i.e., a dry etching rate of Si may depend on the presence of impurities (dopant species).

Referring to FIG. 7, this figure shows a cross section of a marker structure according to an embodiment of the invention. FIG. 7 shows a condition in which the etching rate of the doped Si regions 130 of the lines was relatively higher than the etching rate of the silicon dioxide regions 103 in the trenches. Thus, the surface level of the doped Si regions 130 will be substantially below the surface level of the silicon dioxide regions 103 after the etch step.

The etching of the marker structure may be done simultaneously with the etching of "product" structures. For that reason, the etching of the marker structure may be an "overetching" in comparison to the etching of the actual product structure.

Figure 8:
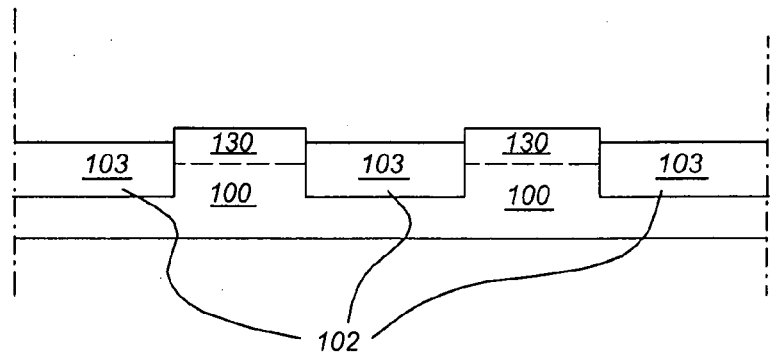
FIG. 8 shows a cross-sectional view of a portion of a marker structure manufactured by an alternative first subsequent processing step according to an embodiment of the invention.

FIG. 8 shows a cross-sectional view of a portion of a marker structure manufactured by an alternative first subsequent processing step, according to an embodiment of the invention. In the alternative first subsequent processing step, an alternative dopant species was used during ion implantation. The alternatively doped Si regions 130 now exhibit an etching rate lower than that of the silicon dioxide regions 103. In this case, the surface level of the alternatively doped Si regions 130 may be substantially above the surface level of the silicon dioxide regions 103 after the etch step.

Figure 9:
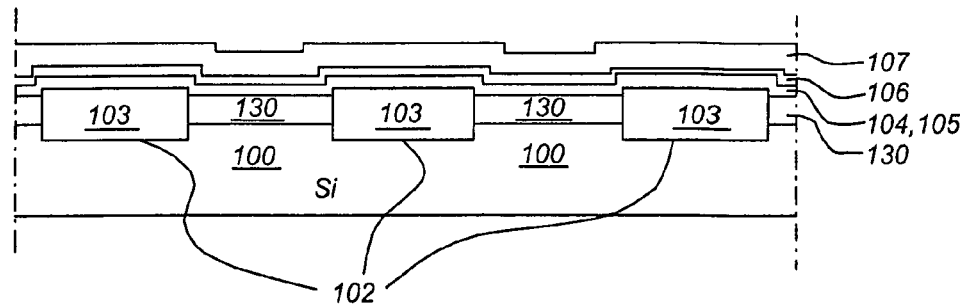
FIG. 9 depicts a marker structure in accordance with an embodiment of the present invention, covered by a gate layer stack.

FIG. 9 depicts a first embodiment of a marker structure covered by a gate layer stack, in accordance with an embodiment of the present invention.

After an etching operation to remove the thin oxide layer 120, further operations may be performed for the formation of the field effect transistor(s): i.e., deposit the gate stack layer and provide patterning on the transistor area(s). In FIG. 9 the marker structure with relatively fast etching Si regions 130 (FIG. 7) is shown covered by the first type gate layer stack 104, 105, 106, 107 as described above with reference to FIG. 3.

The topology difference is preserved when the thickness of the gate layer stack 104, 105, 106, 107 is at least smaller than twice the width of the trenches 102 of the alignment mark. The periodic order of the marker structure is substantially transferred to the surface of the stack, and can be detected optically in a similar manner as the original marker structure below the opaque layer. Moreover, as described above the ion implantation is "self-aligned", and thus the position of the topology corresponds to the position of the marker structure below. As a result, the topology can be used for the same purpose as the marker, i.e., alignment. An alignment system can thus detect a position of a marker structure of the present invention with a topology of elevated and lower surface regions in the marker structure, in a similar manner as a conventional marker structure (phase depth grating). Therefore, the gate layer can be aligned with respect to the shallow trench isolation (STI) layer.

Figure 10:
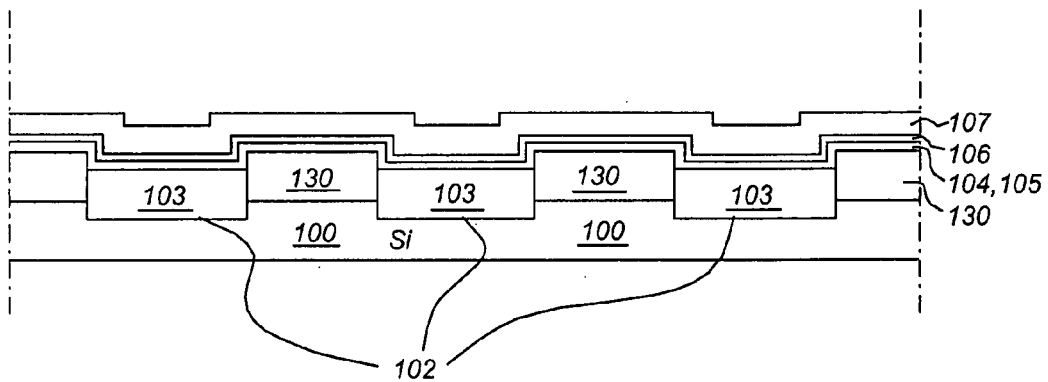
FIG. 10 depicts a marker structure in accordance with an embodiment of the present invention.

FIG. 10 depicts a marker structure in accordance with another embodiment of the present invention. In FIG. 10 the marker structure with relatively slow etching Si regions 130 (FIG. 8) is shown covered by the first type gate layer stack 104, 105, 106, 107 as described earlier.

Here, the topology is reversed with respect to the topology shown in FIG. 9. The surface level portion of the gate layer stack above the Si regions 130 of the marker structure underneath is above the surface level portion of the gate layer stack 104, 105, 106, 107 above the silicon dioxide portions of the marker.

Figure 11:
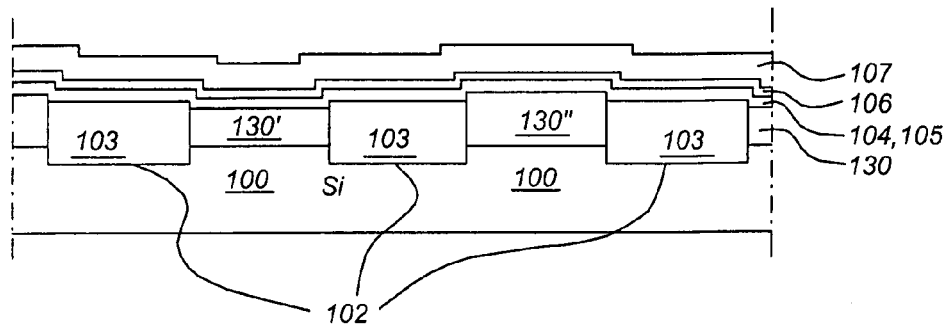
FIG. 11 depicts a marker structure in accordance with an embodiment of the present invention.

FIG. 11 depicts a marker structure in accordance with a further embodiment of the present invention. This embodiment may be viewed as a combination of the first and second embodiment in the sense that in the marker structure three types of portions are created by the ion implantation process: a very slow etching portion, a medium rate etching portion, and a fast etching portion. The three types of portions differ due to the application of different ion beam characteristics (i.e., another ion beam energy and/or flux, and/or another dopant species is used) for each specific portion. So, a first subset of line elements may be exposed to a first dopant species and a first ion implantation beam with first ion beam characteristics, a second subset of line elements may be exposed to a second dopant species and a second ion implantation beam with second ion beam characteristics, wherein the first and second dopant species may differ from each other and/or the ion beam characteristics of the first and second ion implantation beam may differ from each other.

Such a difference in etching rates may be created by an appropriate choice of dopant species and/or dopant doses. For example, in Si n-type, p-type and intrinsic-type areas may be created that each have their specific etching rate in dependence on the dopant species and dopant dose.

A first subset includes first doped Si regions 130' which have a relatively faster etching rate than the silicon dioxide regions 103. A second subset includes second type doped Si regions 130" which have a relatively slower etching rate than the etching rate of the silicon dioxide regions 103.

The etching rates of the first doped Si regions 130', the second doped Si regions 130", and the silicon dioxide regions 103 are given by:

$$ER_{doped\ Si\ 2} < ER_{oxide} < ER_{doped\ Si\ 1}$$

wherein $ER_{doped\ Si\ 1}$ is the etching rate for the first doped Si regions 130', $ER_{doped\ Si\ 2}$ is the etching rate for the second doped Si regions 130" and ER oxide is the etching rate for the silicon dioxide regions 103 in the trenches 102.

After etching, the faster etching Si regions 130' may include a relatively lower surface level, and the relatively slower etching Si regions 130" may include a relatively higher surface level, compared to the surface level of the silicon dioxide regions 103 in the trenches 102.

It should be noted that alternatively both the first doped Si regions 130' and the second doped Si regions 130" may each have a lower etching rate than the silicon dioxide regions 103 in an embodiment of the invention. The etching rates are given by:

$$ER_{doped\ Si\ 1} < ER_{doped\ Si\ 2} < ER_{oxide}.$$

In that case the silicon dioxide regions 103 may display the lowest surface level, the second doped Si regions 130" may display an intermediate surface level, and the first doped Si regions 130' may display the relatively highest surface level in the marker structure.

In a further embodiment of the invention, the etching rates may be given by $$ER_{oxide} < ER_{doped\ Si\ 1} < ER_{doped\ Si\ 2}.$$

In that case the silicon dioxide regions 103 may display the highest surface level, the second doped Si regions 130" may display the lowest surface level, and the first doped Si regions 130' may display the intermediate surface level in the marker structure.

Persons skilled in the art will recognize that various combinations of etching rates for Si relative to each other but also in relation to silicon dioxide can be applied for the creation of topology in a marker structure. Also a skilled person will appreciate that a similar topology can be created for other combinations of materials, provided an etch rate difference can be obtained by the implantation process as described above. Thus, instead of silicon dioxide, other dielectrics may be applied in the marker structure according to an embodiment of the present invention. Also, Si may be replaced by an alternative (semiconductor) material.

It is further noted that the topology of a marker structure according to an embodiment of the invention can be put into use by an (optical) alignment system in a similar manner as a conventional marker structure without opaque layers. In an embodiment as shown in FIG. 11, a signal different from the signal based on the periodicity of the underlying marker structure may be produced. Due to the introduction of three surface levels, the response of the topology may be changed as a function of the actual periodic repetition of the surface levels. A skilled person will appreciate that for a given repetition, the response of the alignment system can be derived.

Also, it is noted that the etching rates may not only vary in relation to an appropriate wet etch process as used here for removal of the sacrificial oxide. In other circumstances, the etching rates may also vary due to the use of, for example, a reactive ion plasma, if applicable.

The implantation step for each dopant species creates a respective region of silicon enriched with that dopant species. After activation of the regions by annealing, each region obtains specific electronic properties (i.e., of n-type, p-type or intrinsic Si). Moreover, the etching properties of Si are dependent on the impurity elements (dopant species) contained therein and also, on the relative concentration. Thus by the implantation steps and the subsequent annealing steps, it may be possible to create silicon regions which exhibit different etching rates based on the dopant species and their relative concentration. In an embodiment of the invention, a grating structure includes surface-level differences (a topology) that are caused by differences in etching rates as a function of the dopant species and their concentration at a given location within the grating structure.

In an embodiment of the invention, dopant species are implanted in the various portions of the marker structure (i.e., the lines). Next, after implantation and activation of the portions, a reactive ion etching process can be used to create the marker structure. During a sacrificial oxide etching process, the etching rate of the various portions will differ due to the presence of a specific dopant species in each of the respective portions. As a result a topology is created, which introduces surface-level differences.

When the topology is created in such a way that it relates to the marker structure and forms a periodic structure on the surface, the topology has the same functionality as a conventional line and trench marker structure. This marker structure may be detected in a similar way as a real marker structure by the same system used for the detection of the real markers on a surface of a substrate.

It will be apparent to the person skilled in the art that other embodiments of the invention can be conceived and reduced to practice without departing from the spirit of the invention. Methods as described herein may also be implemented as software, firmware, hardware, or some combination of these (e.g. in the form of one or more sets of machine-executable instructions stored on a data storage medium such as a disk or computer memory). In an embodiment, there is provided a computer program comprising program code that, when executed on a computer system, instructs the computer system to perform one or more methods as described herein. The description is not intended to limit the invention.

What is claimed is:

1. A method for manufacturing a marker structure on a semiconductor surface of a semiconductor substrate, the marker structure comprising line elements and trench elements, the line elements and trench elements being arranged in a repetitive order in the marker structure, the method comprising:

filling the trench elements with silicon dioxide and leveling the marker structure;

growing a sacrificial oxide layer on the semiconductor surface;

exposing at least a first subset of the line elements to at least a first ion implantation beam to dope at least the first subset of line elements and to change an etching rate of at least the first subset of line elements, said first ion implantation beam comprising a first dopant species and having first ion implementation beam characteristics;

annealing the substrate to activate the first dopant species in at least the first subset of line elements; and etching the semiconductor surface to remove the sacrificial oxide layer and to create a topology such that the first subset of line elements has a first level differing from a second level of a surface portion of the marker structure different from the first subset of line elements.

2. A method for manufacturing a marker structure according to claim 1, wherein the first level of the first subset of line elements is below the second level.

3. A method for manufacturing a marker structure according to claim 1, wherein the first level of the first subset of line elements is above the second level.

4. A method for manufacturing a marker structure according to claim 1, said method comprising:

exposing a second subset of the line elements to at least a second ion implantation beam to dope the second subset of line elements, said second ion implantation beam comprising a second dopant species and having second ion beam characteristics, wherein said etching includes creating a topology such that the second subset of line elements has a third level differing from said first and second levels.

5. A method for manufacturing a marker structure according to claim 1, wherein the first dopant species comprises one of arsenic, phosphorus, antimony, and boron.

6. A method for manufacturing a marker structure according to claim 1, wherein the second dopant species comprises one of arsenic, phosphorus, antimony, and boron.

7. A method for manufacturing a marker structure according to claim 1, wherein the first dopant species differs from the second dopant species.

8. A method for manufacturing a marker structure according to claim 1, wherein the first ion beam characteristics differ from the second ion beam characteristics.

9. A method for manufacturing a marker structure according to claim 1, wherein said surface portion of the marker structure comprises surfaces of silicon dioxide.

10. A device manufacturing method comprising:

manufacturing a marker structure on a substrate, the marker structure comprising line elements and trench elements, the line elements and trench elements being arranged in a repetitive order in the marker structure, said manufacturing a marker structure comprising:

filling the trench elements with silicon dioxide and leveling the marker structure;

growing a sacrificial oxide layer on the semiconductor surface;

exposing at least a first subset of the line elements to at least a first ion implantation beam to dope at least the first subset of line elements and to change an etching rate of at least the first subset of line elements, said first ion implantation beam comprising a first dopant species and having first ion beam characteristics;

annealing the substrate to activate the first dopant species in at least the first subset of line elements; and etching the semiconductor surface to remove the sacrificial oxide layer and to create a topology such that the first subset of line elements has a first level differing from a second level of a surface portion of the marker structure different from the first subset of line elements;

determining a position of said marker structure; and based on said determining, projecting a patterned beam of radiation onto a radiation-sensitive layer on the substrate.

11. A method according to claim 10, further comprising depositing a gate layer stack after said etching, wherein a thickness of the gate layer stack is less than twice the width of said trench elements.

12. A method for aligning a substrate relative to a mask in a lithographic apparatus comprising:

projecting a beam of light onto a marker structure disposed on said substrate;

detecting light diffracted by said marker structure; and adjusting a position of said substrate on the basis of the diffracted light, wherein the marker structure includes a plurality of lines of a first material and a plurality of trenches of a second material that differs from the first material, said plurality of lines and trenches being alternately and contiguously disposed in a substrate, and wherein a first subset of said plurality of lines has a different elevation than said plurality of trenches.

13. A method for manufacturing a marker structure at a surface of a substrate, the marker structure comprising line elements and trench elements arranged in a repetitive order, said method comprising:

filling the trench elements with silicon dioxide;

growing a sacrificial oxide layer on the surface;

exposing at least a first subset of the line elements to an ion implantation beam to change an etching rate of the first subset, said ion implantation beam comprising a dopant species;

annealing the substrate to activate the dopant species in the first subset; and etching the semiconductor surface to remove the sacrificial oxide layer and to create a plurality of levels on the surface such that the first subset of line elements has a first level differing from a second level of a surface portion of the marker structure different from the first subset of line elements.

* * * * *